United States Patent
Naffziger

[19]

[11] Patent Number: 6,166,946

[45] Date of Patent: Dec. 26, 2000

[54] SYSTEM AND METHOD FOR WRITING TO AND READING FROM A MEMORY CELL

[75] Inventor: Samuel D Naffziger, Ft. Collins, Colo.

[73] Assignee: Hewlett-Packard Company, Palo Alto, Calif.

[21] Appl. No.: 09/489,380

[22] Filed: Jan. 21, 2000

[51] Int. Cl.[7] .................................................. G11C 11/00
[52] U.S. Cl. ........................................ 365/154; 365/156
[58] Field of Search .................................... 365/154, 156, 365/203, 194

[56] References Cited

U.S. PATENT DOCUMENTS

| | | | |
|---|---|---|---|
| 5,034,923 | 7/1991 | Kuo et al. ................................ | 365/154 |
| 5,353,251 | 10/1994 | Uratani et al. .......................... | 365/154 |
| 5,450,353 | 9/1995 | Koike ....................................... | 365/154 |
| 5,781,469 | 7/1998 | Pathak et al. ........................... | 365/156 |
| 5,815,432 | 9/1998 | Naffziger et al. ....................... | 365/154 |

Primary Examiner—Trong Phan

[57] ABSTRACT

The present invention generally relates to a memory cell for storing data values. The memory cell of the present invention utilizes a storage element, a multiplexer, first and second bit lines, first and second switching elements, and a switching mechanism. The storage element has a first port and a second port and maintains a value of the first port as an inverse of the value of the second port. The first switching element is connected to the first port and the first bit line, and the second switching element is connected to the second port and the second bit line. An input value to be written to the memory cell is received by the switching mechanism, which transmits the input value to one of the bit lines based on a value of a mode signal. Depending on which bit line is to receive the input value, the switching mechanism may invert the input value before transmitting it to the one bit line. The multiplexer receives the value of the other bit line and selects this value based on the value of the mode signal. The multiplexer then transmits the selected value as an output of the memory cell.

19 Claims, 6 Drawing Sheets

SYSTEM AND METHOD FOR WRITING TO AND READING FROM A MEMORY CELL

BACKGROUND OF THE INVENTION

1. Field of the Invention

The present invention generally relates to data processing techniques and, in particular, to a system and method for performing a writing operation and a reading operation on a memory cell, such as a static-random-access-memory (SRAM) cell, during the same clock cycle.

2. Related Art

SRAM cells are known in the art for storing digital bit values and are used in many electronic applications requiring data storage, such as in the internal cache memory of a microprocessor. Each storage element within a SRAM cell usually stores only one bit of information at a time, and storing a new value into the storage element overwrites the previous value stored in the storage element.

In most conventional SRAM cells, only one value can be written to or read from the cell at a time. Therefore, during a single clock cycle, only a single operation may occur. As used herein, the term "operation" shall refer to a write to or a read from the memory cell that is being described. If there are two or more operations that are ready to occur, then at least one of the operations should be postponed until a later clock cycle such that no more than one operation occurs during each clock cycle. However, the postponement of operations is generally undesirable since it increases the amount of time required to produce the results of the operations.

U.S. Pat. No. 5,815,432, entitled "Single-Ended Read, Dual-Ended Write SRAM Cell," which is incorporated herein by reference, describes a design for a SRAM cell that enables a higher frequency of operations to occur. In this regard, the SRAM cell of the U.S. Pat. No. 5,815,432 enables two simultaneous reads of the same cell to occur. Therefore, during a single clock cycle, either two reads from an SRAM cell or one write to the SRAM cell may occur. As a result, the number of operations that utilize the same SRAM cell during a given time period is increased.

The design provided by U.S. Pat. No. 5,815,432 works well in applications that generate a large number of read operations. However, the advantages of the U.S. Pat. No. 5,815,432 are reduced in applications that utilize a large number of write operations, since the design of the U.S. Pat. No. 5,815,432 only enables read operations to simultaneously occur.

Thus, a heretofore unaddressed need exists in the industry for providing an SRAM cell that enables a write operation and a read operation to occur during the same clock cycle so that the number of write operations serviced during a particular time period can be increased.

SUMMARY OF THE INVENTION

The present invention overcomes the inadequacies and deficiencies of the prior art as discussed hereinbefore. Generally, the present invention provides a system and method for writing to and reading from a memory cell during the same clock cycle.

The memory cell of the present invention utilizes a storage element, a multiplexer, first and second bit lines, first and second switching elements, and a switching mechanism. The storage element has a first port and a second port and maintains a value of the first port as an inverse of the value of the second port. The first switching element is connected to the first port and the first bit line, and the second switching element is connected to the second port and the second bit line. An input value to be written to the memory cell is received by the switching mechanism, which transmits the input value to one of the bit lines based on a value of a mode signal. Depending on which bit line is to receive the input value, the switching mechanism may invert the input value before transmitting it to the one bit line. The multiplexer receives the value of the other bit line and selects this value based on the value of the mode signal. The multiplexer then transmits the selected value as an output of the memory cell.

The present invention can also be viewed as providing a method for storing data values. The method can be broadly conceptualized by the following steps: providing a memory cell, the memory cell having a first port connected to a first bit line via a first switching element and a second port connected to a second bit line via a second switching element; maintaining a value of the first port as an inverse of a value of the second port; receiving an input value; receiving a clock signal; precharging the first and second bit lines in response to the clock signal; storing the input value in the memory cell, via the first bit line, between consecutive precharges of the first and second bit lines; and reading, via the second bit line, a value stored in the memory cell between the consecutive precharges of the first and second bit lines.

Other features and advantages of the present invention will become apparent to one skilled in the art upon examination of the following detailed description, when read in conjunction with the accompanying drawings. It is intended that all such features and advantages be included herein within the scope of the present invention and protected by the claims.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

DETAILED DESCRIPTION OF THE PREFERRED EMBODIMENT

The present invention generally provides a memory cell, such as an SRAM cell, that enables a write operation and a read operation to occur during the same clock cycle. To better illustrate the principles of the present invention, first refer to FIG. 1, which depicts an exemplary SRAM cell 15 of the prior art.

Figure 1:
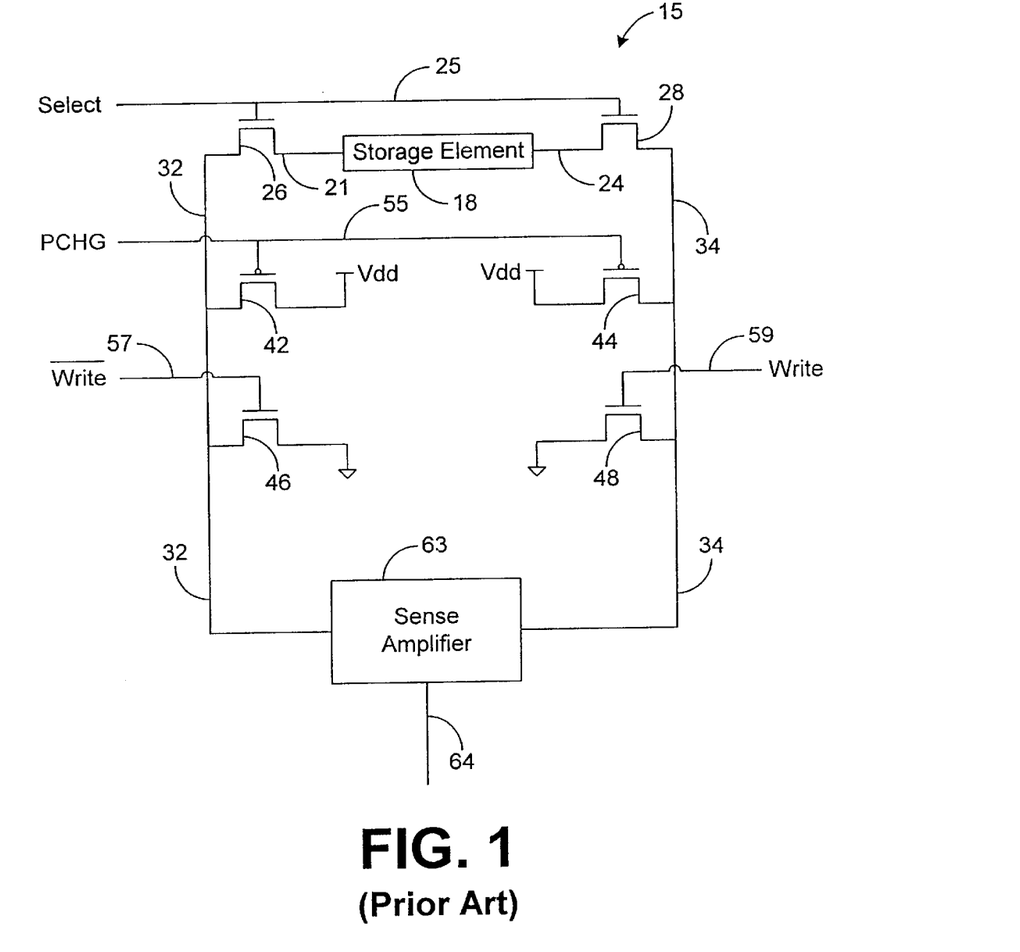
FIG. 1 is a diagram illustrating an SRAM cell in accordance with the prior art.
Figure 2:
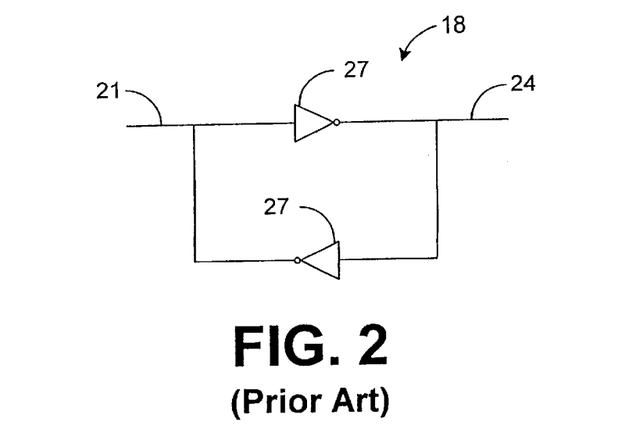
FIG. 2 is a diagram illustrating a more detailed view of a storage element depicted in FIG. 1.

A bit value is stored in a storage element 18, which has two input/output (I/O) ports 21 and 24. The storage element 18 is designed such that at any given time, the value at port 21 should be the inverse of the value at port 24. FIG. 2 depicts an exemplary embodiment of circuitry that may be used to implement the storage element 18. The inverters 27 ensure that the value at ports 21 and 24 are inverse to one another.

The value at port 24 corresponds to the value stored in the storage element 18, and the value at port 21, therefore, corresponds to the inverse of the value stored in the storage element 18. For example, if the value stored in the storage element 18 is a "1," then the value at port 24 should be a logical high, and the value at port 21 should be a logical low. Conversely, if the value stored in the storage element 18 is a "0," then the value at port 24 should be a logical low, and the value at port 21 should be a logical high. In other words, the value at port 24 represents the value stored in the storage element 18.

To store or, in other words, to write a value into storage element 18, the value on select line 25 is asserted to activate the switching elements 26 and 28, and the values on bit lines 32 and 34 are appropriately asserted and deasserted to write the desired value into the storage element 18. In this regard, the storage element 18 is designed such that activation of the switching element 26 enables a logical low on bit line 32 to force the value of port 21 to a logical low and such that activation of the switching element 28 enables a logical low on bit line 34 to force the value of port 24 to a logical low. However, the storage element 18 is further designed such that a logical high on either bit line 32 or 34 does not affect the values at ports 21 and 24 and, therefore, the value stored in the storage element 18, regardless of whether the switching elements 26 and/or 28 are activated or deactivated. To enable the aforementioned functionality, NFETs are usually used to implement the switching elements 26 and 28 as shown by FIG. 1, although it may be possible to utilize other devices in implementing the switching elements 26 and/or 28 in other embodiments.

Therefore, to write a "1" into the storage element 18, the select line 25 is asserted, and the bit line 32 is forced to a logical low and the bit line 34 is forced to a logical high. As a result, the value at port 21 is forced to a logical low, and the value at port 24 (i.e., the value representing the value stored in the storage element 18) is forced to a logical high via the inverters 27 (FIG. 2) of the storage element 18. To write a "0" into the storage element 18, the select line 25 is asserted, and the bit line 34 is forced to a logical low and the bit line 32 is forced to a logical high. As a result, the value at port 24 is forced to a logical low, and the value at port 21 is forced to a logical high via the inverters 27 of the storage element 18.

Switching elements 42, 44, 46, and 48 are typically used to control the value of the bit lines 32 and 34. In this regard, when deactivated, switching elements 42, 44, 46, and 48 (as well as switching elements 26 and 28) are open circuits. Furthermore, when activated, switching elements 42 and 44 allow a supply voltage ($V_{dd}$) to pass to bit lines 32 and 34, respectively, and when activated, switching elements 46 and 48 allow the values of bit lines 32 and 34 to be grounded, respectively. Typically, as shown by FIG. 1, PFETs are used to implement switching elements 42 and 44, and NFETs are used to implement switching elements 46 and 48, although other types of devices may be used to implement switching elements 42, 44, 46, and/or 48 in other embodiments.

In writing a value into storage element 18, the precharge line 55 is asserted during a first half of a cycle of a clock signal to activate switching elements 42 and 44, and the write lines 57 and 59 are deasserted to deactivate the switching elements 46 and 48. As a result, the bit lines 32 and 34 are initially both forced to a logical high. Then, during the next half of the cycle of the clock signal, the precharge line 55 is deasserted to deactivate the switching elements 42 and 44, and the select line 25 is asserted to activate the switching elements 26 and 28. In addition, one of the write lines 57 or 59 is asserted to activate the appropriate switching element 46 or 48 in order to write the desired value into the storage element 18. In this regard, to write a "1" into the storage element 18, write line 57 is asserted to activate the switching element 46, and to write a "0" into the storage element 18, write line 59 is asserted to activate the switching element 48.

In reading the value presently stored in the storage element 18, the precharge line 55 is asserted during a first half of a cycle of the clock signal to activate the switching elements 42 and 44, and the write lines 57 and 59 are deasserted to deactivate the switching elements 46 and 48. Accordingly, the bit lines 32 and 34 are initially both forced to a logical high. Then, during the next half of the cycle of the clock signal, the precharge line 55 is deasserted to deactivate the switching elements 42 and 44, and the select line 25 is asserted to activate the switching elements 26 and 28. When the select line 25 is asserted, the port 21 or 24 having the low logical value forces the adjacent bit line 32 or 34 to a logical low. For example, if the value stored in the storage element is a "1" and the port 21, therefore, is a logical low, then the bit line 32 is forced to a logical low when the select line 25 is asserted. Furthermore, if the value stored in the storage element 18 is a "0" and the port 24 is, therefore, a logical low, then the bit line 34 is forced to a logical low when the select line 25 is asserted.

A sense amplifier 63 is configured to receive the values on bit lines 32 and 34 and to output the same value stored in the storage element 18 via output line 64 based on the values received from bit lines 32 and 34. In this regard, the sense amplifier 63 is designed to output, via output line 64, the value received from bit line 34 as the value read from the cell 15, when the sense amplifier 63 detects a logical difference between the values on bit lines 32 and 34. Therefore, the sense amplifier 63 outputs the value received from bit line 34 as the value read from the cell 15 after the bit lines 32 and 34 have been precharged (i.e., the switching elements 42 and 44 have been activated) and one of the values on bit line 32 or 34 has been forced to a logical low after the precharge.

According to the foregoing techniques, a value can either be written to or read from the storage element 18 for every clock cycle. However, as previously set forth, there are many applications in which it would be desirable to enable write and read operations to occur during the same clock cycles so that the total number of write operations processed in a given time period can be increased.

Figure 3:
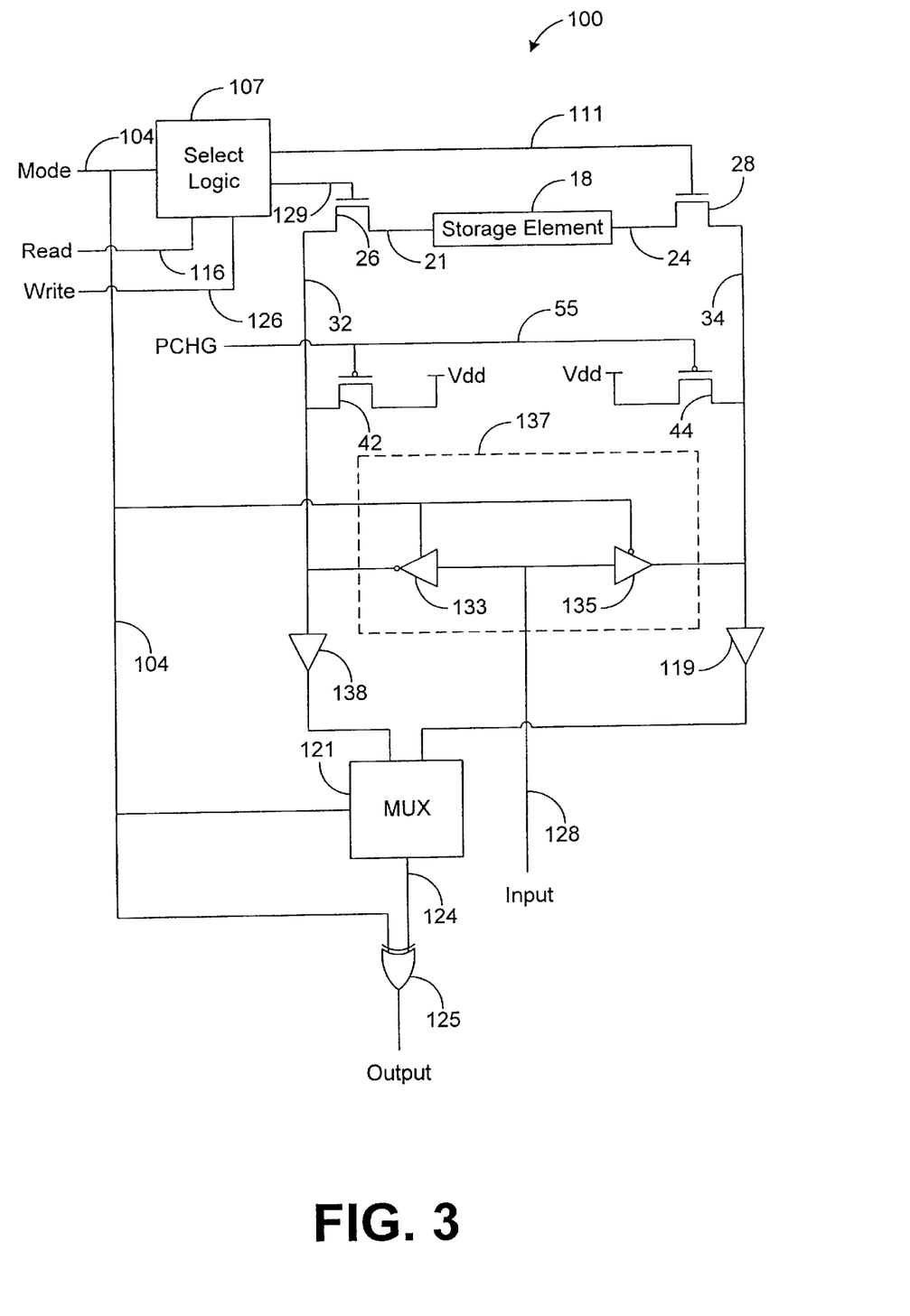
FIG. 3 is a diagram illustrating a memory cell in accordance with the principles of the present invention.

In general the present invention provides a system and method that enables a write operation to be performed with a read operation on the same memory cell during the clock cycle. FIG. 3 depicts a memory cell 100, such as an SRAM cell, in accordance with the principles of the present invention. As shown by FIG. 3, the memory cell 100 includes, similar to conventional memory cell 15, a storage element 18, ports 21 and 24, bit lines 32 and 34, and switching elements 26, 28, 42, and 44. Furthermore, similar to conventional cell 15, the value stored in the storage element 18 is represented by the value at port 24, and the value of port 21 is an inverse of the value of port 24.

Figure 4:
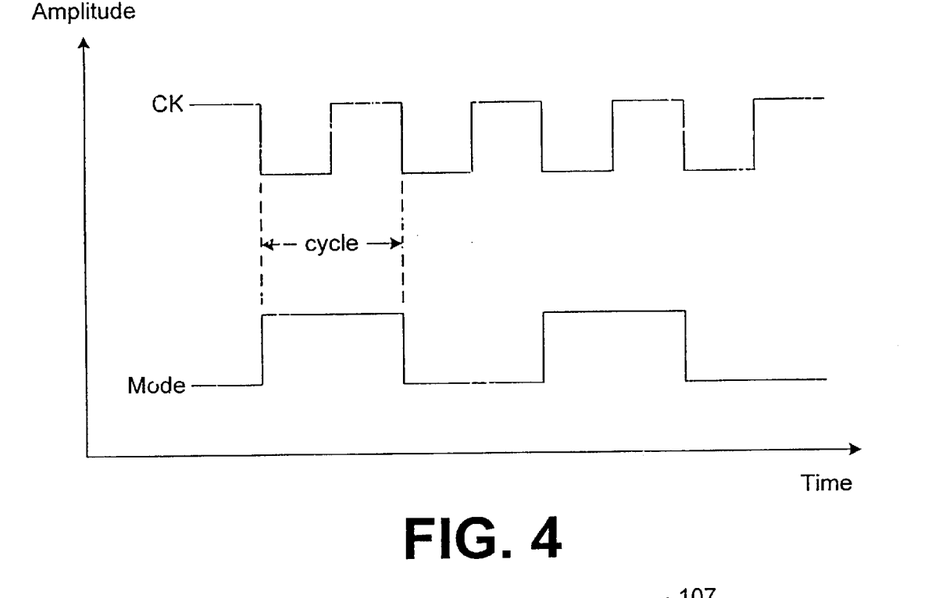
FIG. 4 is a diagram illustrating the graph of a clock signal and a mode signal employed to operate the memory cell of FIG. 3.

A mode signal is provided to the cell 100 via mode line 104. The mode signal is preferably a clock signal having a frequency different than the clock (CK) signal used to control the timing of the cell 100, as will be discussed in further detail hereinbelow. As shown by FIG. 4, the mode signal, in the preferred embodiment, has a frequency that is half that of the CK signal, and the mode signal is synchronized with the CK signal. In other words, the mode signal toggles every cycle of the CK signal. Although the CK signal and the mode signal are shown in FIG. 4 as having different amplitudes for illustrative purposes, the CK signal and the mode signal may have the same amplitude in the preferred embodiment.

To perform a read operation when the mode signal is a logical high, the bit lines 32 and 34 are initially precharged in the first half of a cycle of the CK signal, as is done in the prior art. Then, during the next half of the cycle of the CK signal, the select logic 107 is designed to assert select line 111. In this regard, the select logic 107 receives the mode signal and a read signal via mode line 104 and a read line 116, respectively. The value on read line 116 is preferably a logical high when a read operation is to be performed and a logical low when a read operation is not to be performed. Therefore, when the mode signal on mode line 104 and the read signal on read line 116 are both a logical high, the select circuitry 107 is configured to assert the value transmitted across select line 111, thereby activating the switching element 28. This forces the logical value of bit line 34 to the logical value of the port 24 (i.e., the value stored in the memory element 18).

The foregoing logical value is then passed through an amplifier 119 and received by a multiplexer 121. Note that the amplifier 119 may be positioned before the multiplexer 121 (e.g., at the input of the multiplexer 121), as shown by FIG. 3, or after the multiplexer 121 (e.g., at the output of the multiplexer 121). Based on the mode signal, the multiplexer 121 is configured to select the logical value received from bit line 34 and to transmit this logical value via output line 124. In this regard, the multiplexer 121 is configured to receive the mode signal via mode line 104 as a control signal and to select the value received from bit line 34 when the mode signal is a logical high. When the mode signal is a logical low, the multiplexer 121 is configured to select the value received from bit line 32 instead and to transmit this value via output line 124.

The value transmitted across output line 124 is received by an exclusive—or (XOR) gate 125, which also receives the mode signal from mode line 104. Therefore, when the mode signal is a logical high, the XOR gate 125 outputs the value received from output line 124. As will be later discussed, when the mode signal is a logical low, the XOR gate 125 outputs the inverse of the value received from output line 124. The logical value output by XOR gate 125 should be the logical value stored in storage element 18 (i.e., is the value read from memory cell 100).

While the logical value in the storage element 18 is being read via bit line 34, a write operation may be simultaneously performed using bit line 32. In this regard, the write signal on write line 126 is preferably forced to a logical high when a write operation is to be performed and forced to a logical low when a write operation is not to be performed. Furthermore, the logical value to be written to the storage element 18 is transmitted across input line 128 when the write signal is forced to a logical high.

After both bit lines 32 and 34 have been precharged in the first half of a cycle of the CK signal and when the write signal on write line 126 and the mode signal on mode line 104 are both a logical high, the select logic 107 is configured to assert the value transmitted across select line 129, thereby activating the switching element 26 during the next half of the cycle of the CK signal. Furthermore, the mode signal is transmitted as a control signal to switching elements 133 and 135 of a switching mechanism 137. In the preferred embodiment, as shown by FIG. 3, the switching elements 133 and 135 are tri-state amplifiers but may be any other type of switch in other embodiments. Furthermore, other configurations of the switching mechanism 137 may exist without departing from the principles of the present invention.

When the mode signal is a logical high, the switching element 133 is designed to transmit an inverse of the value from input line 128 to bit line 32. Therefore, if the value on input line 128 is a logical high, the value of bit line 32 is forced to a logical low. As a result, the value at port 21 is forced to a logical low, and the value at port 24 is, therefore, forced to a logical high (i.e., a "1" is written into the storage element 18) via the inverters 27 (FIG. 2) of the storage element 18. If the value on input line 128 is a logical low, then the value of bit line 32 is forced to a logical high, and no change occurs to the value at ports 21 and 24.

Furthermore, when the mode signal on mode line 104 is a logical high, the switching element 135 is designed to operate as an open circuit. Therefore, any value on input line 128 should not be transmitted by the switching element 135. As a result, the value being read from the cell 100 via bit line 34 should not be affected by the value on input line 128.

To perform a read operation when the mode signal is a logical low, the bit lines 32 and 34 are initially precharged in the first half of a cycle of CK, as is done in the prior art. Then, during the next half of the cycle of the CK signal, the select logic 107 is designed to assert select line 129 in response to the logical high on read line 116 and the logical low on mode line 104, thereby activating the switching element 26. This forces the logical value of bit line 32 to the logical value of the port 21 (i.e., the inverse of the value stored in the memory element 18).

The logical value on bit line 32 is then passed through an amplifier 138 and received by multiplexer 121. Note that the amplifier 138 may be positioned before the multiplexer 121 (e.g., at the input of the multiplexer 121), as shown by FIG. 3, or after the multiplexer 121 (e.g., at the output of the multiplexer 121). In response to the logical low on mode line 104, the multiplexer 121 is configured to select the logical value received from bit line 32 and to transmit this logical value via output line 124. As previously indicated, the XOR gate 125 is configured to output an inverse of this value in response to the logical low on mode line 104. Therefore, the logical value output by XOR gate 125 should be the logical value stored in storage element 18 (i.e., is the value read from memory cell 100).

While the logical value in the storage element 18 is being read via bit line 32, a write operation may be simultaneously performed using bit line 34. As previously set forth, when a write operation is to be performed, the write signal on write line 126 is preferably forced to a logical high, and the logical value to be written to the storage element 18 is transmitted across input line 128. In response to the logical high on write line 126 and the logical low on mode line 104, the select logic 107 is configured to assert the value transmitted across select line 111, thereby activating the switching element 28 during the last half of a cycle of the CK signal (i.e., after bit lines 32 and 34 have been precharged).

Furthermore, as described hereinabove, the mode signal is transmitted via mode line 104 as a control signal to switching elements 133 and 135. When the mode signal is a logical low, the switching element 135 is designed to transmit the value from input line 128 to bit line 34. Therefore, if the value on input line 128 is a logical low, the value of bit line 34 is forced to a logical low. As a result, the value at port 24 is forced to a logical low (i.e., a "0" is written into the storage element 18), and the value at port 21 is, therefore, forced to a logical high via the inverters 27 (FIG. 2) of the storage element 18. If the value on input line 128 is a logical high, then the value of bit line 34 is forced to a logical high, and no change occurs to the value at ports 21 and 24.

Furthermore, when the mode signal on mode line 104 is a logical low, the switching element 133 is designed to operate as an open circuit. Therefore, any value on the input line 128 should not be transmitted by the switching element 133. As a result, the value being read from the cell 100 via bit line 32 should not be affected by the value on input line 128.

Figure 5:
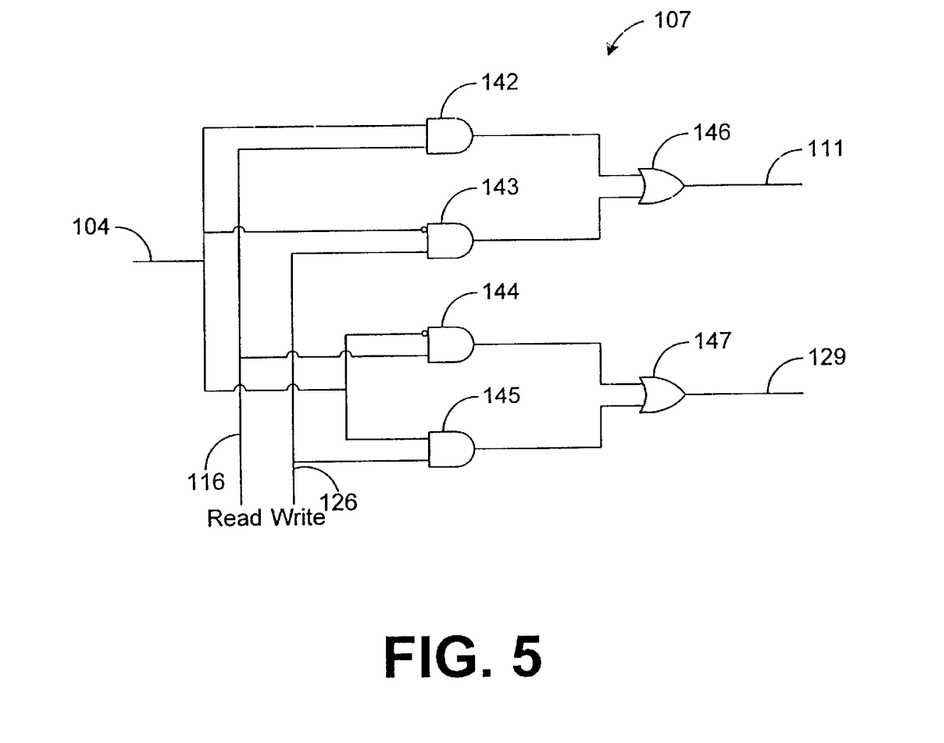
FIG. 5 is a diagram illustrating a more detailed view of select circuitry depicted in FIG. 3.

FIG. 5 shows exemplary circuitry that may be used to implement the select logic 107. In this regard, the select logic 107 shown by FIG. 5 includes AND gates 142, 143, 144 and 145 and includes OR gates 146 and 147. When the mode signal on mode line 104 is a logical high, the AND gate 142 and OR gate 146 are configured to assert the value transmitted across select line 111, if the read signal on read line 116 is a logical high. If the read signal on read line 116 is a logical low when the mode signal is a logical high, then AND gates 142 and 143 and the OR gate 146 are designed to deassert the value transmitted across select line 111.

Furthermore, when the mode signal on mode line 104 is a logical high, the AND gate 145 and OR gate 147 are configured to assert the value transmitted across select line 129, if the write signal on write line 126 is a logical high. If the write signal on write line 126 is a logical low when the mode signal is a logical high, then AND gates 144 and 145 and the OR gate 147 are designed to deassert the value transmitted across select line 129.

When the mode signal on mode line 104 is a logical low, the AND gate 143 and OR gate 146 are configured to assert the value transmitted across select line 111, if the write signal on write line 126 is a logical high. If the write signal on write line 126 is a logical low when the mode signal is a logical low, then AND gates 142 and 143 and the OR gate 146 are designed to deassert the value transmitted across select line 111.

In addition, when the mode signal on mode line 104 is a logical low, the AND gate 144 and OR gate 147 are configured to assert the value transmitted across select line 129, if the read signal on read line 116 is a logical high. If the read signal on read line 116 is a logical low when the mode signal is a logical low, then AND gates 144 and 145 and the OR gate 147 are designed to deassert the value transmitted across select line 129.

Figure 6:
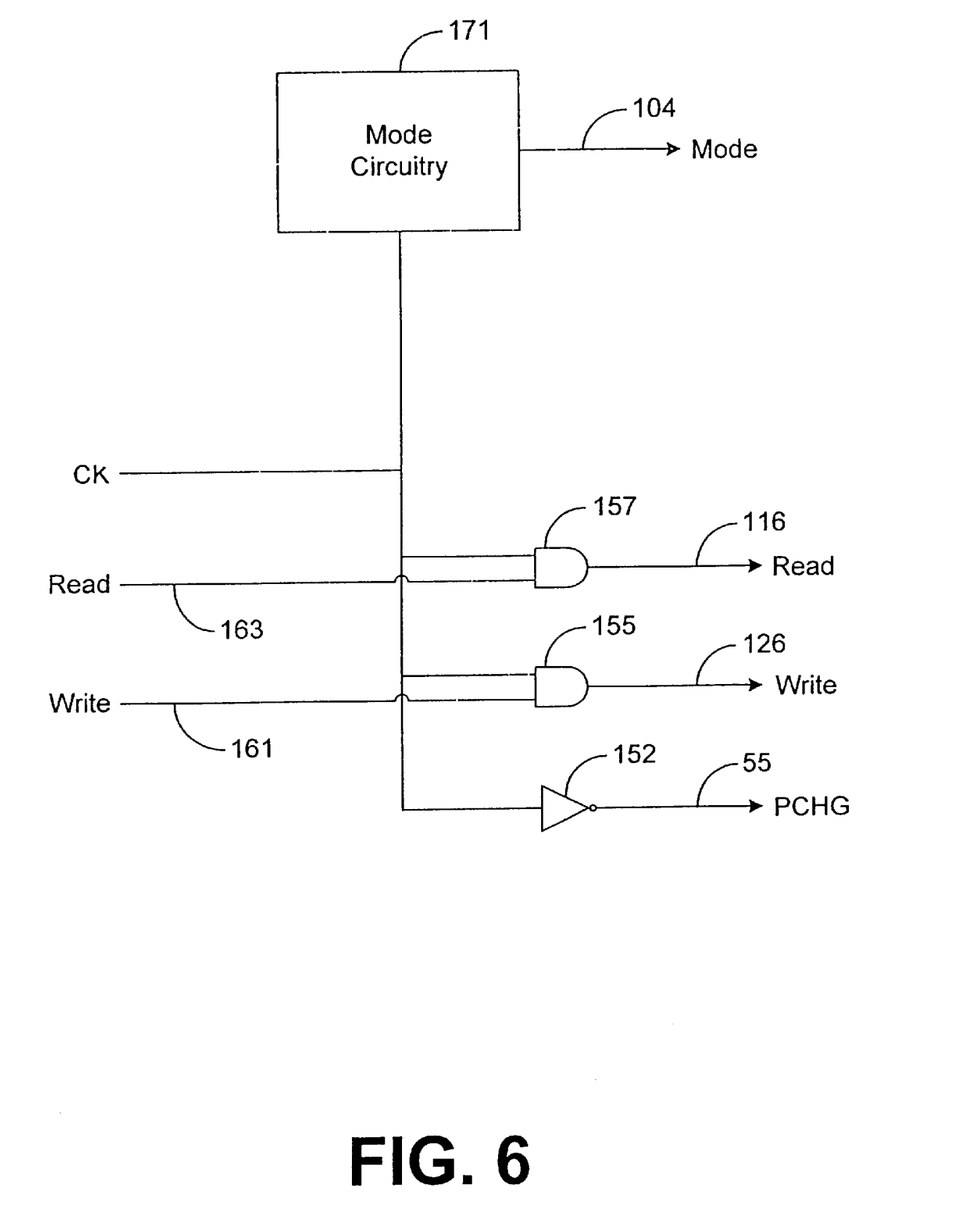
FIG. 6 is exemplary circuitry that may be used to control the timing of the mode signal, the read signal, and the write signal of the preferred embodiment depicted by FIG. 3.

Furthermore, FIG. 6 depicts exemplary circuitry that may be used to control the timing of the signals transmitted across lines 55, 104, 116, and 121 based on the CK signal. In this regard, an inverse value of the CK signal is transmitted across precharge line 55 by an inverter 152. Therefore, the value on precharge line 55 is asserted during the first half of a cycle of the CK signal and is deasserted during the last half of the cycle of the CK signal. As a result, the switching elements 42 and 44 (FIG. 3) are activated during the first half of the cycle of the CK signal, thereby forcing the values of bit lines 32 and 34 to $V_{dd}$ or, in other words, to a logical high. During the last half of the cycle of the CK signal, the switching elements 42 and 44 are deactivated, thereby isolating bit lines 32 and 34 from $V_{dd}$.

Furthermore, during the first half of the cycle of the CK signal, AND gates 155 and 157 are configured to deassert the values transmitted across lines 116 and 126, respectively, regardless of the values of the read signal and the write signal respectively received from lines 161 and 163. The write signal on line 161, when asserted, indicates that the value on input line 128 should be written to the storage element 18 and, when deasserted, indicates that a write operation should not occur. The read signal on line 163, when asserted, indicates that the value stored in the storage element 18 should be output by the cell 100 and, when deasserted, indicates that no read operation should occur.

During the last half of the cycle of the CK signal, the CK signal is a logical high in the preferred embodiment. Therefore, AND gate 155 transmits the value received from line 161 to write line 126, and AND gate 157 transmits the value received from line 163 to read line 116. As a result, read and write operations are enabled only in the last half of the cycle of the CK signal. In other words, read and write operations are enabled only after bit lines 32 and 34 have been precharged.

Mode circuitry 171 is configured to receive the CK signal. Based on the CK signal, the mode circuitry 171 produces the mode signal and transmits the mode signal across mode line 104. As set forth hereinabove, the mode signal is preferably synchronized with the CK signal such that the mode signal toggles when the CK signal completes a cycle.

OPERATION

The preferred use and operation of the memory cell 100 and associated methodology are described hereafter.

Assume for illustrative purpose that it is desirable to perform a read operation and a write operation on the memory cell 100. Further assume that during the present cycle of the CK signal, the mode signal is toggled to a logical high. As a result, the write signal on write line 126, the read signal on read line 116, and the mode signal on mode line 104 are all set to a logical high, during the last half of a cycle of the CK signal (i.e., after bit lines 32 and 34 have been precharged). In response, the select logic 107 asserts the signals on select lines 111 and 129, and the switching elements 26 and 28 are activated. Since the mode signal is a logical high, the value stored in the storage element 18 is read via bit line 34 and the value to be written into the storage element 18 is transmitted to bit line 32. If the value to be written into the storage element 18 is a logical high, then the value of port 21 is forced to a logical low, and the value of port 24 is, therefore, forced to a logical high. As a result, the write operation and the read operation are performed during the same cycle of the CK signal.

However, if the value to be written into the storage element 18 is a logical low, then the values at ports 21 and 24 remain unchanged. Therefore, at the beginning of the next cycle of the CK signal, the mode signal toggles to a logical low, and the value on input line 128 (i.e., the value to be written into the storage element 18) is maintained on input line 128. Furthermore, the value of the write signal on line 126 is maintained at a logical high. Therefore, during the last half of this next cycle of the CK signal, the value of select line 111 is asserted, thereby activating switching element 28. Since the mode signal is now a logical low, the value to be written into the storage element 18 is transmitted to bit line 34 via switching element 135. Since the foregoing value is a logical low and the switching element 28 is activated, the value at port 24 is forced to a logical low, and the value at port 21 is, therefore, forced to a logical high. Note that during this cycle of the CK signal, another read operation may be performed utilizing bit line 32.

As a result, the value to be written into the storage element 18 by a write operation is written into the storage element 18 in one of the foregoing two cycles of the CK signal. It is possible to also perform a different read operation in each of these two cycles. Therefore, by utilizing the techniques described hereinabove, it is possible to increase the number of operations performed on the memory cell 100.

It should be noted that the present invention has been described hereinabove as utilizing a storage element having two ports 21 and 24 from which to read and write data. However, the present invention should not be so limited. In this regard multi-ported memory cells are well known in the art, and it is possible for the memory cell 100 of the present invention to include other storage elements 18 and/or other ports 21 and/or 24.

Alternative Embodiments

It should be noted that, depending on the timing of the signals transmitted by memory cell 100, it is possible for a write operation occurring during the same cycle as a read operation to affect the value read from the cell 100 via the read operation. In this regard, the value written by the write operation may overwrite the previous value stored in the storage element 18 before the previous value is read from the storage element 18 by the read operation. Therefore, additional steps may be taken to ensure the integrity of the data read from the cell 100.

Figure 7:
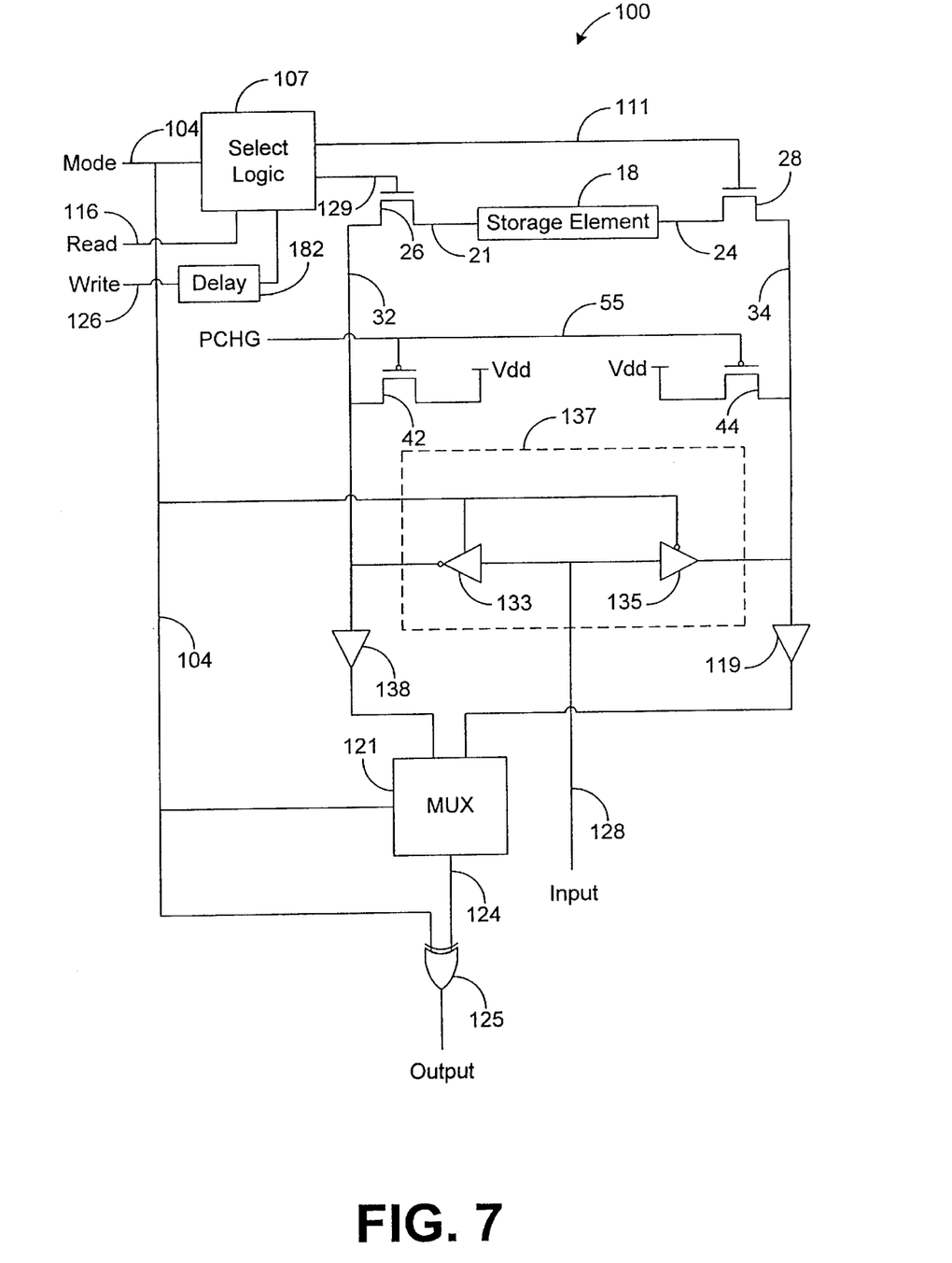
FIG. 7 is a diagram illustrating another embodiment of a memory cell in accordance with the present invention.

In one embodiment, as depicted by FIG. 7, the write operation may be delayed a sufficient amount of time to ensure that the write operation does not overwrite the data read by the read operation. In this embodiment, the write signal transmitted to select logic 107 via write connection 126 may pass through a delay mechanism 182. The delay mechanism 182 is designed to delay the write signal a sufficient amount of time to ensure that the write operation does not overwrite the data read by any read operations occurring during the same cycle of the CK signal.

Figure 8:
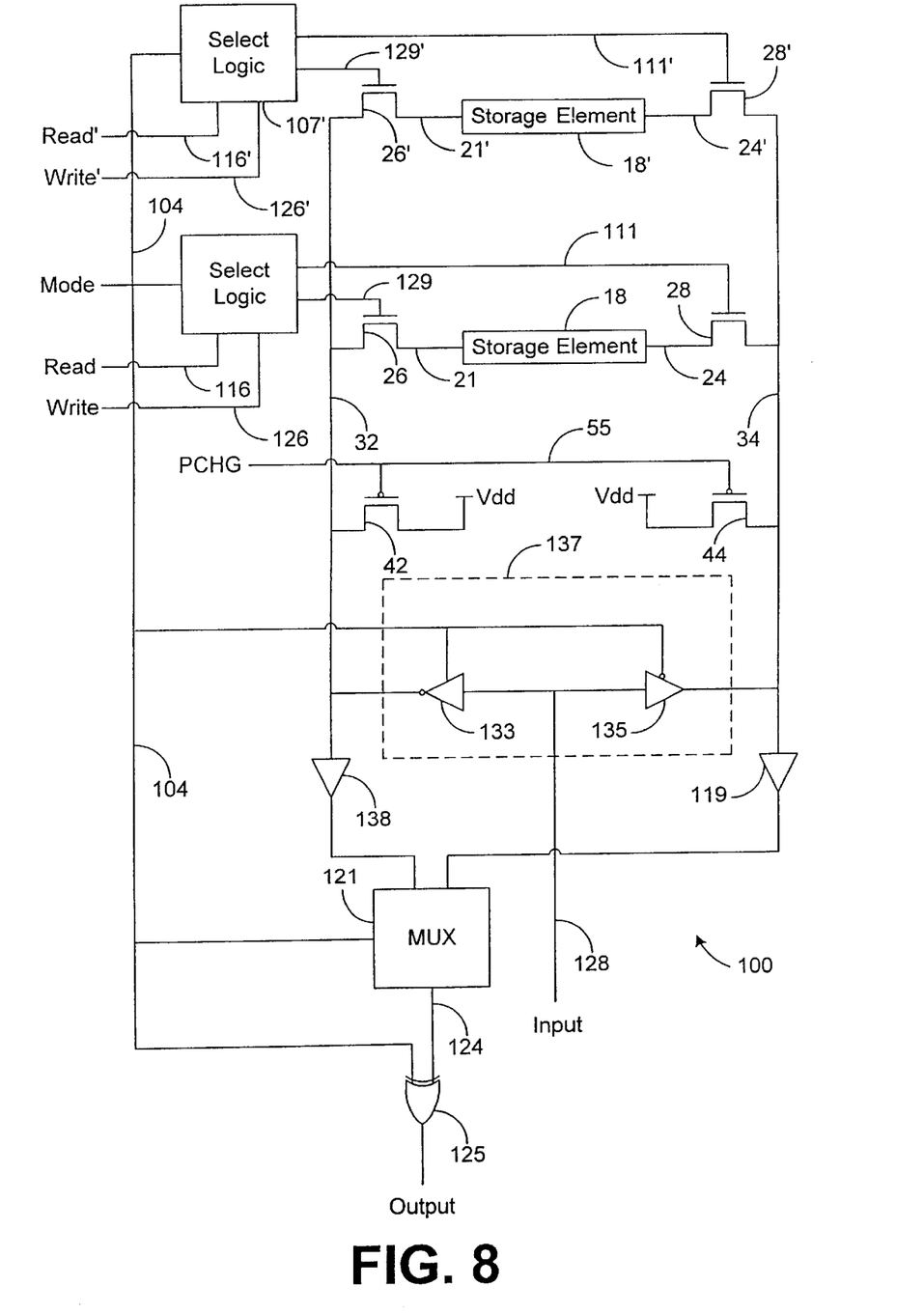
FIG. 8 is a diagram illustrating yet another embodiment of a memory cell in accordance with the present invention.

In another embodiment, the read and write operation occurring during the same cycle of the CK signal may be prevented from accessing the same storage element 18. In this embodiment, at least one other storage element 18' is included in the memory cell 100, as shown by FIG. 8. The storage element 18' is configured identical to storage element 18 and, therefore, includes two ports 21' and 24'. The value at port 21' should be the inverse of the value at port 24', and the value at port 24' represents the value stored in the storage element 18'.

The cell 100 depicted by FIG. 8 also includes select logic 107' that is configured identical to select logic 107. Therefore, the select logic 107' controls the states of switching elements 26' and 28' based on a read' signal and a write' signal respectively received from connections 116' and 126' in the same way that select logic 107 controls the states of switching elements 26 and 28 based on a read signal and a write signal respectively received from connections 116 and 126.

Instead of performing a read and a write operation on the same storage element 18 during the same cycle of the CK signal, as previously described, a read operation may be performed on one of the storage elements 18 or 18' via one of the bit lines 32 or 34 while a write operation is performed on the other of the storage elements 18 or 18' via the other bit line 32 or 34. As a result, the value written to the cell 100 via the write operation should not overwrite the value read from the cell 100 via the read operation, even though the two operations are simultaneously performed.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Now, therefore, the following is claimed:

1. A memory cell, comprising:

a first bit line;

a second bit line;

an input line;

an output line;

a storage element having a first port and a second port, said storage element configured to control a value of said first port and a value of said second port, said storage element further configured to maintain said value of said first port as an inverse of said value of said second port;

a first switching element coupled to said first port and to said first bit line, said first switching element configured to activate and deactivate in response to a first select signal, said first switching element further configured to electrically connect said first port to said first bit line when activated and to electrically disconnect said first port from said first bit line when deactivated;

a second switching element coupled to said second port and to said second bit line, said second switching element configured to activate and deactivate in response to a second select signal, said second switching element configured to electrically connect said second port to said second bit line when activated and to electrically disconnect said second port from said second bit line when deactivated;

a multiplexer coupled to said output line, said multiplexer configured to receive a value from said first bit line and to receive a value from said second bit line and to select one of said values received by said multiplexer based on a mode signal, said multiplexer further configured to transmit said one value selected by said multiplexer across said output line; and a switching mechanism coupled to said input line, said switching mechanism configured to receive an input value from said input line and, based on said mode signal, to select one of said bit lines, said switching mechanism further configured to electrically connect said selected one of said bit lines to said input line and to electrically disconnect the other bit line from said input line.

2. The memory cell of claim 1, wherein said memory cell is a static-random-access-memory (SRAM) cell.

3. The memory cell of claim 1, wherein said switching mechanism includes:
   a third switching element coupled to said input line, said third switching element configured to electrically connect said input line to said first bit line when said mode signal exhibits a first logical state and to electrically disconnect said input line from said first bit line when said mode signal exhibits a second logical state; and
   a fourth switching element coupled to said input line, said fourth switching element configured to electrically connect said input line to said second bit line when said mode signal exhibits said second logical state and to electrically disconnect said input line from said second bit line when said mode signal exhibits said first logical state.

4. The memory cell of claim 3, wherein said fourth switching element is further configured to invert said input signal.

5. The memory cell of claim 1, further comprising:
   select circuitry configured receive a clock signal, a read signal and a write signal, said select circuitry further configured to transmit said first select signal to said first switching element based on said read signal and said clock signal and to transmit said second select signal to said second switching element based on said write signal and said clock signal,
   wherein said mode signal is based on said clock signal and has a frequency different than a frequency of said clock signal.

6. The memory cell of claim 5, wherein said select circuitry is configured receive said mode signal, said select circuitry further configured to transmit said first select signal to said first switching element based on said mode signal and to transmit said second select signal to said second switching element based on said mode signal.

7. A memory cell, comprising:
   a storage element having a first port and a second port, said storage element configured to control a value of said first port and a value of said second port, said storage element further configured to maintain said value of said first port as an inverse of said value of said second port;
   a first bit line;
   a second bit line;
   a first switching element connected to said first bit line and to said first port;
   a second switching element connected to said second bit line and to said second port;
   a switching mechanism configured to receive an input value and to transmit said input value to one of said bit lines based on a value of a mode signal; and
   a multiplexer configured to receive a value from the other bit line and to select said value from said other bit line based on said value of said mode signal, said multiplexer further configured to transmit said selected value.

8. The memory cell of claim 7, further comprising:
   circuitry configured to receive a clock signal and to control when said switching mechanism transmits said input value based on said clock signal, said mode signal having a different frequency than a frequency of said clock signal.

9. The memory cell of claim 7, wherein said switching mechanism, before transmitting said input value to said one bit line, is further configured to invert said input value depending on which of said bit lines is to receive said input value.

10. A memory cell, comprising:
    a storage element having a first port and a second port, said storage element configured to control a value of said first port and a value of said second port, said storage element further configured to maintain said value of said first port as an inverse of said value of said second port;
    a first bit line;
    a second bit line;
    a first switching element connected to said first bit line and to said first port;
    a second switching element connected to said second bit line and to said second port;
    means for receiving a clock signal;
    means for precharging said first and second bit lines in response to said clock signal;
    means for receiving an input value;
    means for storing said input value in said memory cell, via said first bit line, between consecutive precharges of said first and second bit lines; and
    means for reading, via said second bit line, a value stored in said memory cell between said consecutive precharges of said first and second bit lines.

11. The memory cell of claim 10, wherein said memory cell is a static-random-access-memory (SRAM) cell.

12. The memory cell of claim 10, further comprising:
    means for producing a mode signal based on said clock signal;
    an output line;
    an input line;
    a multiplexer coupled to said output line, said multiplexer configured to simultaneously receive a plurality of values from said bit lines, said multiplexer further configured to select one of said values received by said multiplexer based on said mode signal, said multiplexer further configured to transmit said one value selected by said multiplexer across said output line; and
    a switching mechanism coupled to said input line, said switching mechanism configured receive an input value from said input line and to transmit said input value to said storage element via one of said bit lines based on said mode signal.

13. The memory cell of claim 12, wherein said producing means is configured to toggle said mode signal once per cycle of said clock signal.

14. A method for storing data values, comprising the steps of:
    providing a memory cell, said memory cell having a first port connected to a first bit line via a first switching element and a second port connected to a second bit line via a second switching element;
    maintaining a value of said first port as an inverse of a value of said second port;
    receiving an input value;
    receiving a clock signal;
    precharging said first and second bit lines in response to said clock signal;
    storing said input value in said memory cell, via said first bit line, between consecutive precharges of said first and second bit lines; and
    reading, via said second bit line, a value stored in said memory cell between said consecutive precharges of said first and second bit lines.

15. The method of claim 14, further comprising the step of simultaneously performing said storing and reading steps.

16. The method of claim 14, further comprising the steps of:

performing said storing via said first bit line step and said reading via said second bit line step based on a logical value of said input value;

receiving another input value;

storing said other input value in said memory cell, via said second bit line, based on a logical value of said other input value; and reading, via said first bit line, a value stored in said memory cell based on said logical value of said other input value; and performing said storing via said second bit line step and said reading via said first bit line step between consecutive precharges of said first and second bit lines.

17. The method of claim 14, further comprising the steps of:

producing a mode signal based on said clock signal;

transmitting said input value to said first bit line based on said mode signal;

simultaneously receiving a value of said first bit line and a value of said second bit line;

selecting, based on said mode signal, one of said values received in said simultaneously receiving step, said one value corresponding to said value read in said reading step; and transmitting said one value selected in said selecting step.

18. The method of claim 17, further comprising the step of:

toggling said mode signal once per cycle of said clock signal.

19. The method of claim 17, further comprising the step of:

inverting said input value before transmitting said input value to said first bit line.

* * * * *